(12) United States Patent
Shin

(10) Patent No.: US 6,214,648 B1
(45) Date of Patent: Apr. 10, 2001

(54) SEMICONDUCTOR CHIP PACKAGE AND METHOD FOR FABRICATING THE SAME

(75) Inventor: Myeong Jin Shin, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/604,762

(22) Filed: Jun. 26, 2000

Related U.S. Application Data

(62) Division of application No. 08/966,703, filed on Nov. 10, 1997.

(30) Foreign Application Priority Data

Dec. 31, 1996 (KR) .................................................. 96-79246

(51) Int. Cl.⁷ ........................... H01L 21/44; H01L 21/48; H01L 21/50
(52) U.S. Cl. .......................... 438/125; 438/106; 438/107; 438/110; 438/112; 438/108; 438/126
(58) Field of Search .................................. 438/106, 107, 438/110, 112, 118, 125, 126

(56) References Cited

U.S. PATENT DOCUMENTS

| | | | |
|---|---|---|---|
| 3,489,956 | * 1/1970 | Yani et al. | 357/728 |
| 4,672,151 | * 6/1987 | Yamamura | 361/704 |
| 5,377,077 | * 12/1994 | Burns | 174/52.4 |
| 5,574,314 | * 11/1996 | Okada et al. | 257/664 |

* cited by examiner

*Primary Examiner*—Jey Tsai
*Assistant Examiner*—David A. Zarneke
(74) *Attorney, Agent, or Firm*—Birch, Stewart, Kolasch & Birch, LLP

(57) ABSTRACT

The semiconductor chip package includes a package body with a recess and a plurality of barrier parts formed along one side thereof. Each of the barrier parts has a first region and a second region projecting from the first region, and adjacent first regions are separated by a slot. A semiconductor chip, including a reference surface having a circuit and a plurality of bonding pads formed thereon, is disposed in the recess of the package body. A conductive member is disposed in each slot, and a connecting member, associated with each bonding pad, electrically connects the associated bonding pad with a corresponding conductive member. A sealing member seals the semiconductor chip, the connecting members, and at least a portion of the conductive members in contact with the connecting members. Stacking these packages in the transverse and/or longitudinal direction further reduces their mounting area and increases the integrated capacity per unit of mounting area.

24 Claims, 9 Drawing Sheets

SEMICONDUCTOR CHIP PACKAGE AND METHOD FOR FABRICATING THE SAME

This application is a divisional of co-pending application Ser. No. 08/966,703, filed on Nov. 10, 1997, the entire contents of which are hereby incorporated by reference.

BACKGROUND OF THE INVENTION

1. Field of the Invention

The present invention relates to a semiconductor chip package and, more particularly, to a semiconductor chip package in which longitudinal and transverse direction package stacking is made easy for reducing mounting area and increasing integrated capacity per unit mounting area; and a method for fabricating the same.

2. Discussion of the Related Art

There are, in general, the hole insertion mounting type semiconductor chip package and the surface mounting type semiconductor chip package. In the hole insertion mounting type semiconductor chip package, outer leads of the package are inserted into holes formed in an interconnection substrate and then soldered. Typical hole insertion mounting type semiconductor chip packages include DIP (Dual Inline Package), SIP (Single Inline Package), PGA (Pin Grid Array), and etc. In the surface mounting type semiconductor chip package, the package is mounted on a surface of the interconnection substrate. Typical surface mounting type semiconductor chip packages include SOP (Small Outline Package), SOJ (Small Outline J-bend), QFP (Quad Flat Package), and etc.

Of the conventional semiconductor chip packages, the DIP, SOP and SOJ chip packages disadvantageously require a large mounting area (i.e., total connection area between the chip package and the interconnection substrate) because the outer leads thereof project from both sides of the package body and no stacking is possible. That is, a semiconductor chip package of the DIP, SOP and SOJ types has a limited overall device packing density, and the packing density cannot be increased unless a wider mounting board is used because all the leads projecting from both sides of the package body must come in contact with connection pads on the interconnection substrate. Moreover, because creating these conventional semiconductor chip packages requires many steps in the packaging process, such as trimming of dam bars supporting bars of the lead frame and bending the outer leads to a required form, many problems, such as a drop in productivity, exist.

SUMMARY OF THE INVENTION

Accordingly, the present invention is directed to a semiconductor chip package and a method for fabricating the same that substantially obviates one or more of the problems due to limitations and disadvantages of the related art.

Another object of the present invention is to provide a semiconductor chip package and method of fabricating the same which increases the packing density per unit of mounting area.

These and other objects are achieved by providing a semiconductor chip package, comprising: a package body including a recess and a plurality of barrier parts formed along one side thereof, each of the barrier parts having a first region and a second region projecting from the first region, adjacent first regions being separated by a slot; a semiconductor chip, including a reference surface having a circuit and a plurality of bonding pads formed thereon, disposed in the recess of the package body; a conductive member disposed in each slot; a connecting member, associated with each bonding pad, electrically connecting the associated bonding pad with a corresponding conductive member; and a sealing member sealing the semiconductor chip, the connecting members, and at least a portion of the conductive members in contact with the connecting members.

These and other objectives are further achieved by providing a semiconductor chip package, comprising: at least first and second packages, each of said first and second packages including, a package body including a recess and a plurality of barrier parts formed along one side thereof, each of the barrier parts having a first region and a second region projecting from the first region, adjacent first regions being separated by a slot; a semiconductor chip, including a reference surface having a circuit and a plurality of bonding pads formed thereon, disposed in the recess of the package body; a conductive member disposed in each slot adjacent to one of the second regions, each conductive member and adjacent second region forming a projecting member, and adjacent projecting members being separated by a gap; a connecting member, associated with each bonding pad, electrically connecting the associated bonding pad with a corresponding conductive member; a sealing member sealing the semiconductor chip, the connecting members, and at least a portion of the conductive members in contact with the connecting members; and the projecting members of the first package interdigitating with the projecting members of the second package.

These and other objectives are still further achieved by providing a semiconductor chip package comprising: at least first and second packages, each of said first and second packages including, a package body including a recess and a plurality of barrier parts formed along one side thereof, each of the barrier parts having a first region and a second region projecting from the first region, adjacent first regions being separated by a slot; a semiconductor chip, including a reference surface having a circuit and a plurality of bonding pads formed thereon, disposed in the recess of the package body; a conductive member disposed in each slot adjacent to one of the second regions; a connecting member, associated with each bonding pad, electrically connecting the associated bonding pad with a corresponding conductive member; a sealing member sealing the semiconductor chip, the connecting members, and at least a portion of the conductive members in contact with the connecting members; and the second package being stacked on the first package with each conductive member of the second package being electrically connected to a corresponding one of the conductive members of the first package.

These and other objectives are also achieved by providing a method for fabricating a semiconductor chip package, comprising the steps of: (a) forming a package body with a plurality of conductive members attached thereto, the package body including a recess and a plurality of barrier parts formed along one side thereof, each of the barrier parts having a first region and a second region projecting from the first region, adjacent first regions being separated by a slot, and one of the conductive members disposed in each slot; (b) disposing a semiconductor chip in the recess of the package body, the semiconductor chip including a reference surface having a circuit and a plurality of bonding pads formed thereon; (c) electrically connecting each bonding pad with a corresponding conductive member; and (d) sealing the semiconductor chip and at least a portion of the conductive members in electrical contact with the semiconductor chip.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings:

In the drawings:

FIG. 17 illustrates a longitudinal section of the semiconductor chip packages of the present invention stacked in both longitudinal and transverse directions; and, FIGS. 18A and 18B illustrate plan views of a conventional semiconductor chip package and the semiconductor chip package of the present invention, respectively, for comparing their mounted states; wherein.

DETAILED DESCRIPTION OF THE PREFERRED EMBODIMENT

Figure 1:
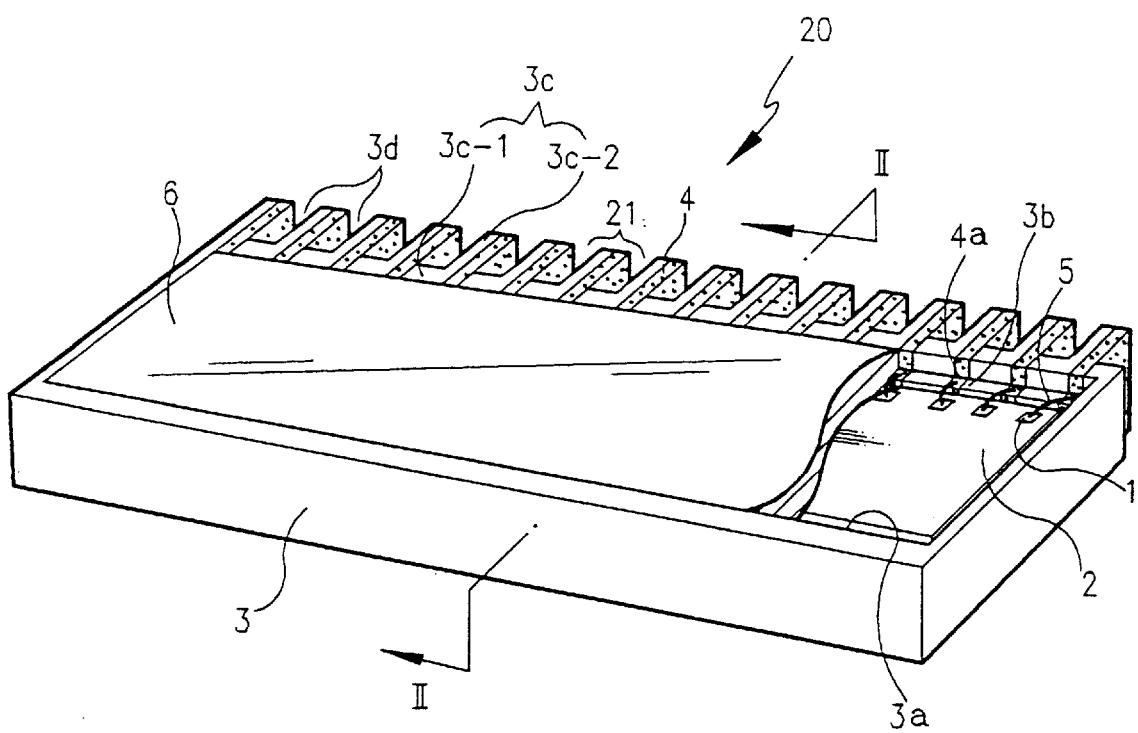
FIG. 1 illustrates a perspective view of a semiconductor chip package in accordance with a preferred embodiment of the present invention with a partial cut away view.
Figure 2:
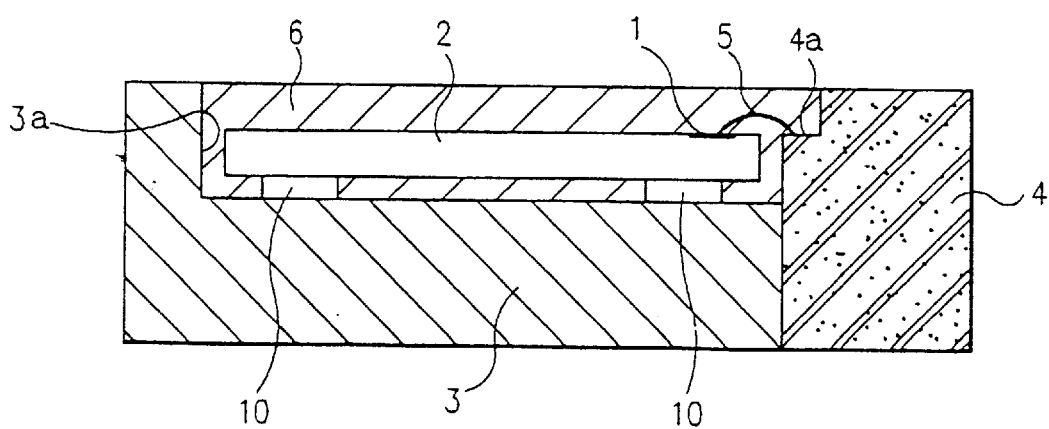
FIG. 2 illustrates a longitudinal section of the semiconductor chip package shown in FIG. 1 across line II—II.

FIG. 1 illustrates a perspective view and partial cut-away view of a semiconductor chip package in accordance with a preferred embodiment of the present invention, and FIG. 2 illustrates a longitudinal section of the semiconductor chip package shown in FIG. 1 across line II—II.

Referring to FIGS. 1 and 2, the semiconductor chip package 20 in accordance with a preferred embodiment of the present invention includes a rectangular semiconductor chip 2 having a reference surface with a circuit and bonding pads 1 formed thereon. The semiconductor chip package 20 also includes a package body 3 having both a recess 3a with the semiconductor chip 2 placed therein and a plurality of barrier parts 3c. The package body 3 is preferably formed of an insulating material such as an epoxy molding compound, plastic, or ceramic. As shown in FIG. 2, the semiconductor chip 2 is fixed within the recess 3a to the package body 3 by adhesive 10. The adhesive 10 is preferably an epoxy or a polyimide.

As shown in FIG. 1, the barrier parts 3c have a step structure forming one side wall of the recess 3a. Each of the barrier parts 3c includes a first region 3c-1, and a second region 3c-2 extending from the first region 3c-1. Adjacent first regions 3c-1 are separated by a slot 3b. As shown in FIG. 1, the slots 3b between adjacent first regions 3c-1 are smaller than the gaps between adjacent second regions 3c-2.

A conductive member 4 is inserted in each slot 3b, and attached to the package body 3. Each conductive member 4 also has a step structure which matches the step structure of the barrier parts 3c as shown in FIG. 1. The conductive members 4 may be formed of metal such as aluminum or copper alloy. Each second region 3c-2 and adjacent conductive member 4 form a projecting member 21. Adjacent projecting members 21 are separated by a gap 3d. The gap 3d has a width greater than the thickness of a conductive member 4, and, preferably, has a width equal to or greater than the total thickness of a projecting member 21.

A plurality of connecting members 5 electrically connect the bonding pads 1 on the semiconductor chip 2 to a corresponding one of the conductive members 4, and a sealing member 6 seals the interconnected structure of the semiconductor chip 2, the package body 3, and the conductive members 4.

Next, several embodiments according to the present invention using the above-discussed embodiment will be described followed by a description of the method for fabricating the semiconductor chip package according to this embodiment.

A second embodiment of the present invention will be explained with reference to FIGS. 14 and 15.

Figure 14:
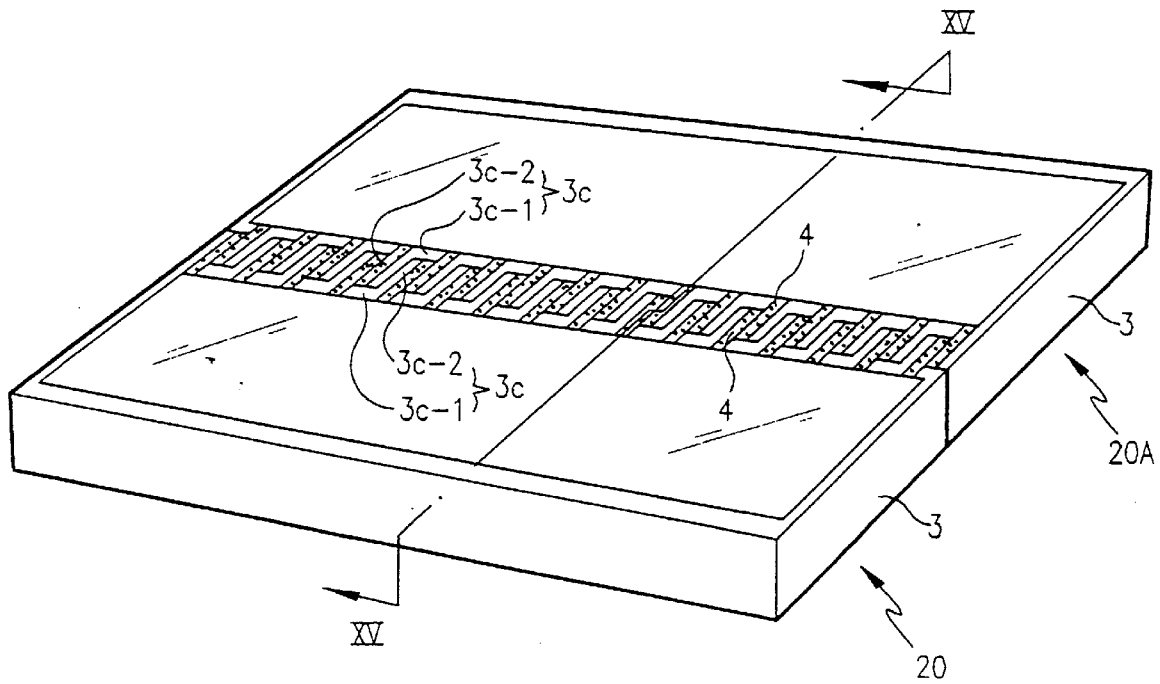
FIG. 14 illustrates a perspective view of the semiconductor chip packages of the present invention stacked in a transverse direction.
Figure 15:
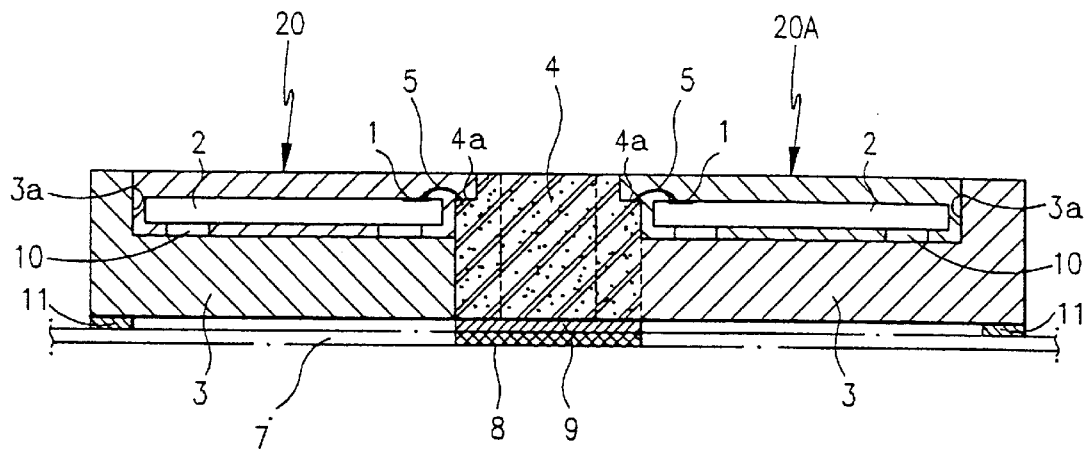
FIG. 15 illustrates a longitudinal section across the line XV—XV shown in FIG. 14.

FIG. 14 illustrates a perspective view of the semiconductor chip packages of the present invention stacked in a transverse direction, and FIG. 15 illustrates a longitudinal section across the line XV—XV shown in FIG. 14. FIG. 14 shows a first semiconductor chip package 20 according to the embodiment of FIG. 1 and a mirror image thereof (second semiconductor chip package 20A) transversely stacked.

As shown in FIG. 14, the projecting members 21 of the first semiconductor chip package 20 interdigitate with the projecting members 21 of the second semiconductor chip package 20. More specifically, each second region 3c-2 and adjacent conductive member 4 of the first semiconductor chip package 20 extend into a corresponding gap 3d of the second semiconductor chip package 20A, and each second region 3c-2 and adjacent conductive member 4 of the second semiconductor chip package 20A extend into a corresponding gap 3d of the first semiconductor chip package 20. As a result, as shown in FIG. 14, each second region 3c-2 of the first semiconductor chip package 20 engages with a second region 3c-2 of the second semiconductor chip package 20A, and each conductive member 4 of the first semiconductor chip package 20 contacts a conductive member 4 of the second semiconductor chip package 20.

As shown in FIG. 15, the conductive members 4 of the first and second semiconductor chip packages 20 and 20A are electrically connected to pads 8 on a mounting board 7 by solder 9. The package bodies 3 of the first and second semiconductor chip packages 20 and 20A are also mounted to the mounting board 7 via adhesive 11. As shown in FIG. 15, the conductive members 4 of the first and second semiconductor chip packages 20 and 20A substantially overlap such that the connection area between the conductive members 4 with the pad 8 is substantially reduced (i.e., the mounting area is substantially reduced).

While in the embodiment according to the second invention, such as shown in FIG. 14, corresponding conductive members 4 of the first and second semiconductor chip packages 20 and 20A come into contact with each other, the gaps 3d for the first and second semiconductor chip packages 20 and 20A, may be large enough that the conductive members 4 do not come into contact. In this event, the conductive members 4 can be electrically connected using solder.

The transverse stacking type semiconductor chip package in accordance with the second embodiment of the present invention reduces the mounting area through the above-discussed inter-digital connection which thereby connects the first and second semiconductor chip packages 20 and 20A in a transverse direction. The engaged second regions 3c-2 of the first and second semiconductor chip packages 20 and 20A serve as a barrier for preventing one set of conductive members 4 from the first and second semiconductor chip packages 20 and 20A, in contact with each other, from coming into contact with another set of conductive members 4, in contact with each other.

Figure 16:
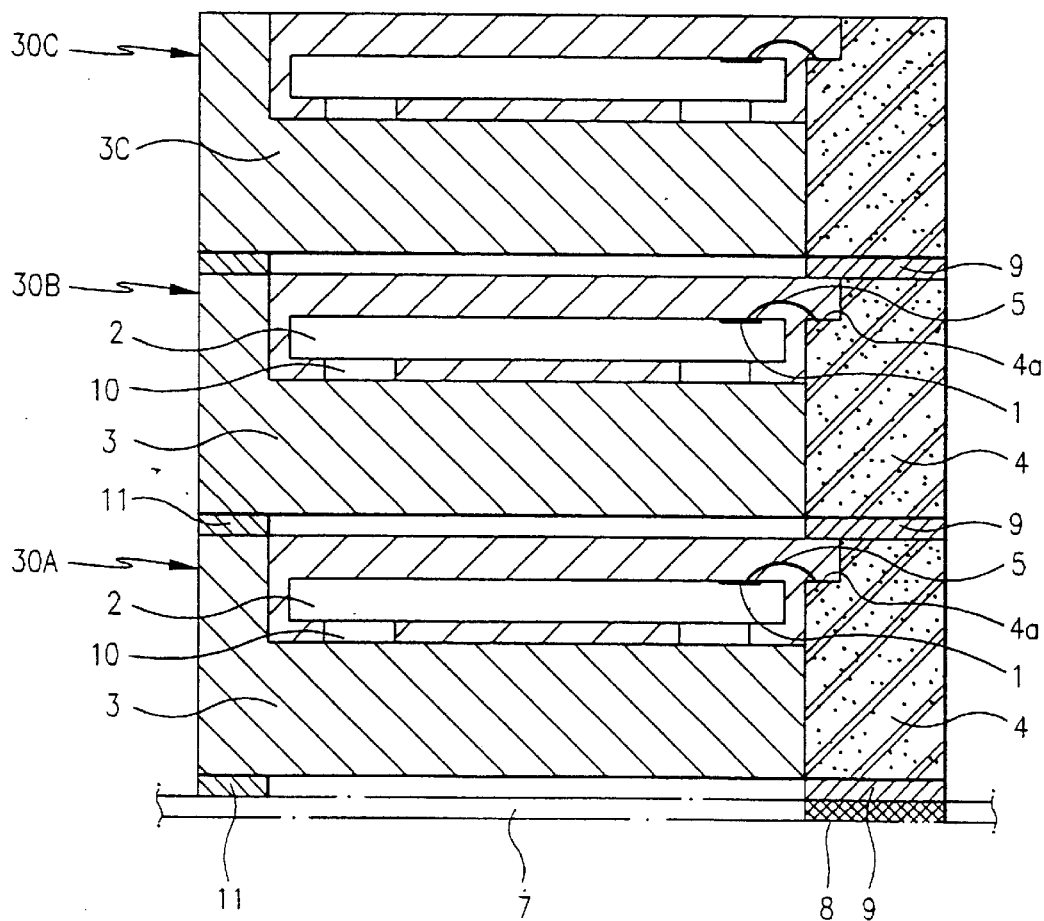
FIG. 16 illustrates a longitudinal section of the semiconductor chip packages of the present invention stacked in a longitudinal direction.

FIG. 16 illustrates a sectional view of a third embodiment of the present invention wherein the semiconductor chip packages according to the present invention are stacked in a longitudinal direction. As shown in FIG. 16, the bottom of a conductive member 4 of a first semiconductor chip package 30A is attached to a pad 8 on a mounting board 7 by solder 9, and a package body 3 of the first package 30A is attached to the mounting board 7 by an adhesive 11. The bottom of the conductive member 4 of a second semiconductor chip package 30B is attached to an upper surface of the conductive member 4 of the underlying first semiconductor chip package 30A by solder 9, and the package body 3 of the second semiconductor chip package 30B is attached to the package body 3 of the first semiconductor chip package 30A by adhesive 11. A third semiconductor chip package 30C is stacked on top of and connected to the second semiconductor chip package 30B in the same manner that the second semiconductor chip package 30B is connected to the first semiconductor chip package 30A. By stacking the semiconductor chip packages in the longitudinal direction as shown in FIG. 16, the mounting area is reduced.

Furthermore, while FIG. 16 illustrates three semiconductor chip packages stacked in the longitudinal direction, the number of stacked packages can be greater or less than three.

Figure 17:
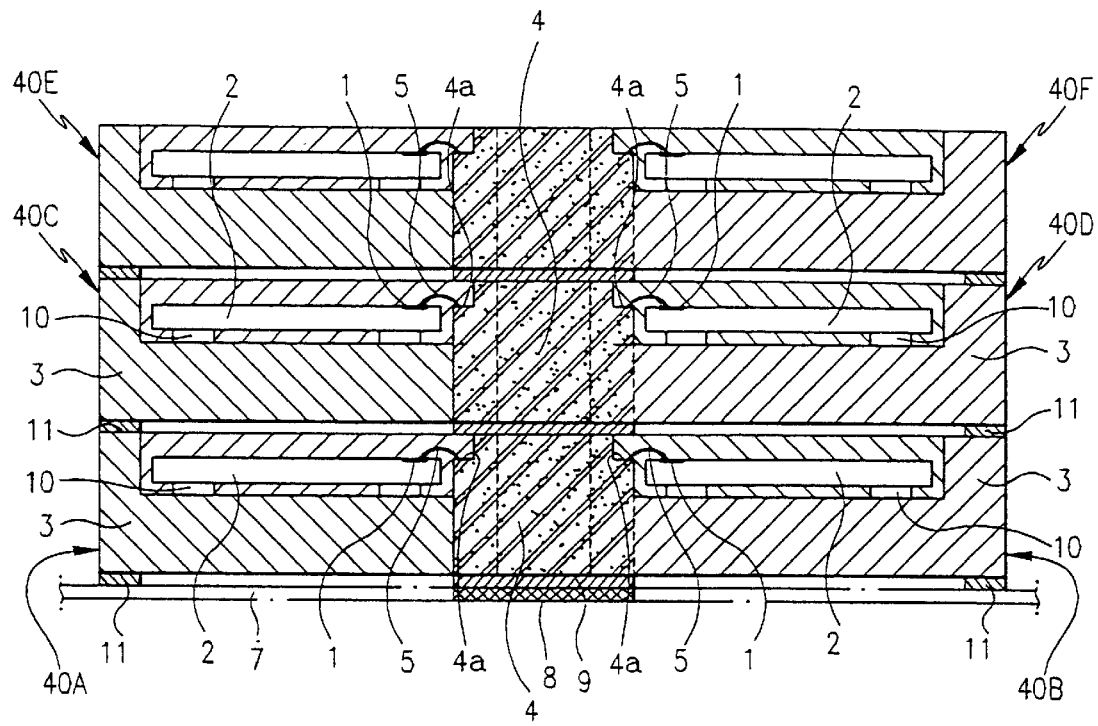

FIG. 17 illustrates a sectional view of a fourth embodiment of the present invention, in which the semiconductor chip packages of the first embodiment are stacked in both the longitudinal and transverse directions. As shown in FIG. 17, first and second semiconductor chip packages 40A and 40B are stacked transversely in the same manner according to the second embodiment of the present invention shown in FIG. 15. The first and second semiconductor chip packages 40A and 40B are also connected to the mounting board 7 in the same manner as shown in FIG. 15. Specifically, the conductive members 4 of the first and second semiconductor chip packages 40A and 40B are soldered to the bonding pad 8, while the package bodies 3 of the first and second semiconductor chip packages 40A and 40B are fixed to the mounting board 7 by adhesive 11.

Third and fourth semiconductor chip packages 40C and 40D are also transversely connected in the manner shown in FIG. 15. The third and fourth semiconductor chip packages 40C and 40D are stacked on top of the first and second semiconductor chip packages 40A and 40B, respectively, in the same manner as shown in FIG. 16. Namely, the conductive members 4 of the third and fourth semiconductor chip packages 40C and 40D are electrically connected to the conductive members 4 of the first and second packages 40A and 40B by solder 9, while the package bodies 3 of the third and fourth semiconductor chip packages 40C and 40D are connected to the package bodies 3 of the first and second semiconductor chip packages 40A and 40B by adhesive 11.

Fifth and sixth semiconductor chip packages 40E and 40F are transversely connected to one another in the same manner as discussed with respect to the third and fourth semiconductor chip packages 40C and 40D. Also, the fifth and sixth semiconductor chip packages 40E and 40F are longitudinally stacked and connected to the third and fourth semiconductor chip packages 40C and 40D in the same manner that the third and fourth semiconductor chip packages 40C and 40D are longitudinally stacked and connected to the first and second semiconductor chip packages 40A and 40B. By stacking the semiconductor chip packages in both the longitudinal and transverse directions as shown in FIG. 17, the mounting area is further reduced.

While FIG. 17 illustrates three levels of longitudinal stacking, the number of stacked levels can be greater or less than 3.

A method for fabricating the semiconductor chip package in accordance with the present invention will be explained with reference to FIGS. 3 to 12.

Figure 3:
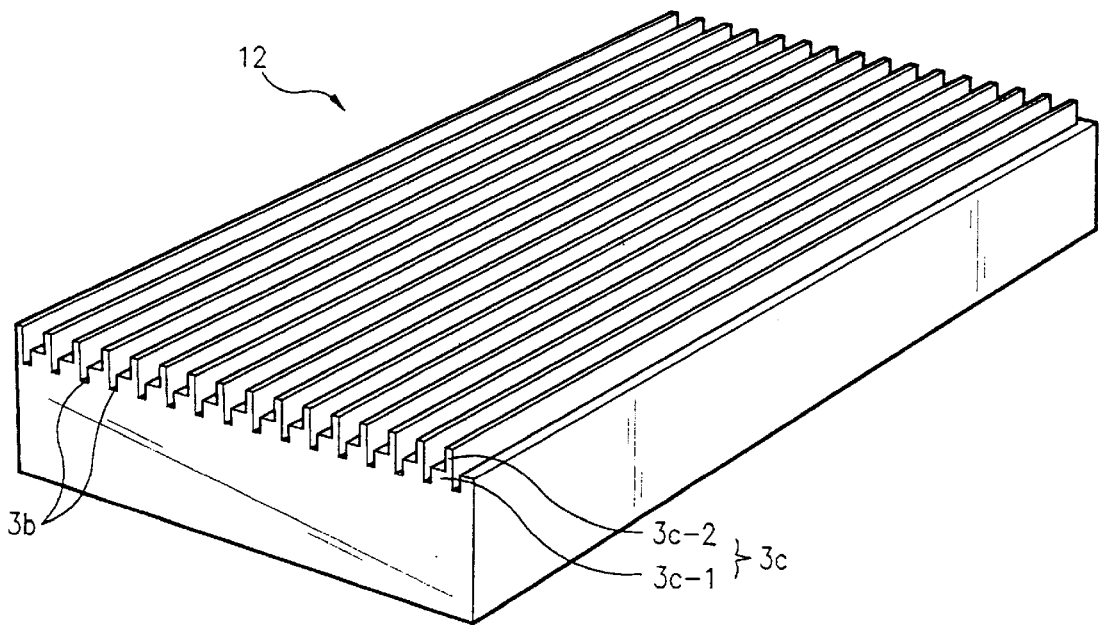
FIG. 3 illustrates a perspective view of a body frame for fabricating the package body shown in FIG. 2.

Referring to FIG. 3, a body frame 12 is formed to include a plurality of barrier parts 3c. Each barrier part 3c has a first region 3c-1 and a second region 3c-2 extending from the first region 3c-1. Slots 3b separate adjacent first regions 3c-1. The body frame 12 may be formed of insulating material such as an epoxy molding compound, a plastic or ceramic, and is preferably formed by casting.

Figure 4:
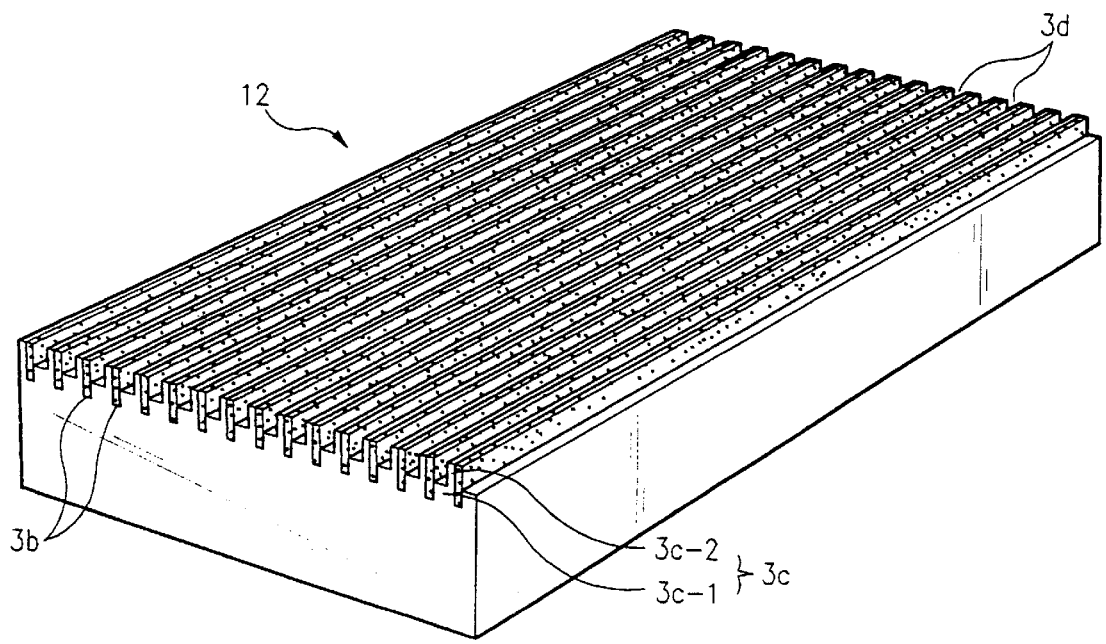
FIG. 4 illustrates the body frame shown in FIG. 3 with conductive members attached thereto.

Referring to FIG. 4, after formation of the body frame 12, a conductive member 4, which serves as an outer lead, is disposed in each of the slots 3b formed between adjacent first regions 3c-1. The conductive member 4 is preferably made of metal such as aluminum or a copper alloy. A gap 3d remains between projecting members 21, each formed of a second region 3c-2 and an adjacent conductive member 4. The gap 3d has a width greater than the conductive member 4, and preferably a width equal to or greater than the total width of the conductive member 4 and the second region 3c-2.

Figure 5:
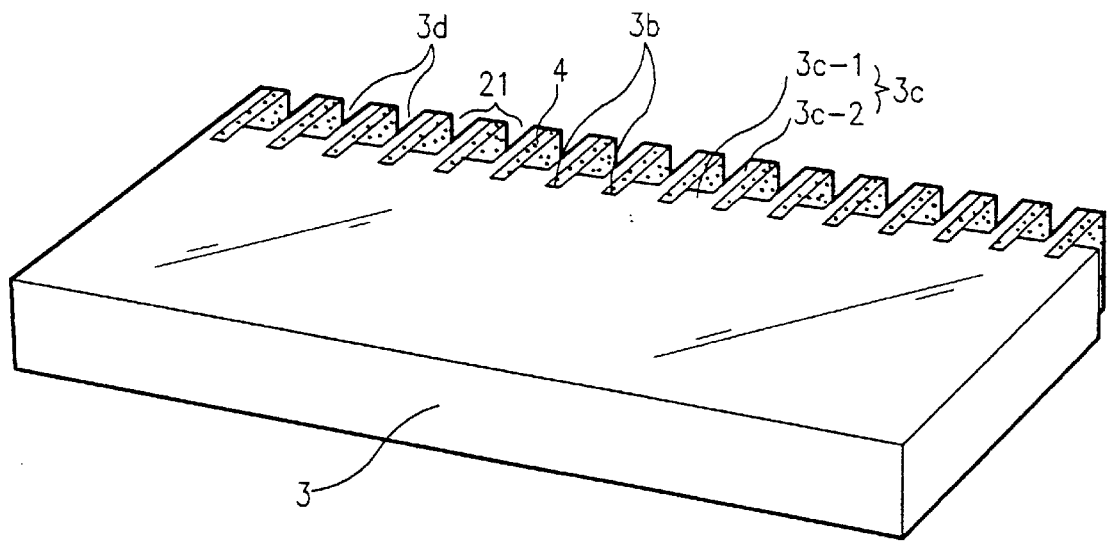
FIG. 5 illustrates a perspective view of a unit package body obtained by slicing the body frame shown in FIG. 4.

Referring to FIG. 5, after attaching the conductive member 4, the body frame 12 is sliced in fixed widths at right angles to a direction of the slots 3b to obtain a plurality of package bodies 3.

Thus, the package body 3 having the conductive members 4, which serve as the outer leads in the semiconductor chip package, can be formed easily.

Figure 6:
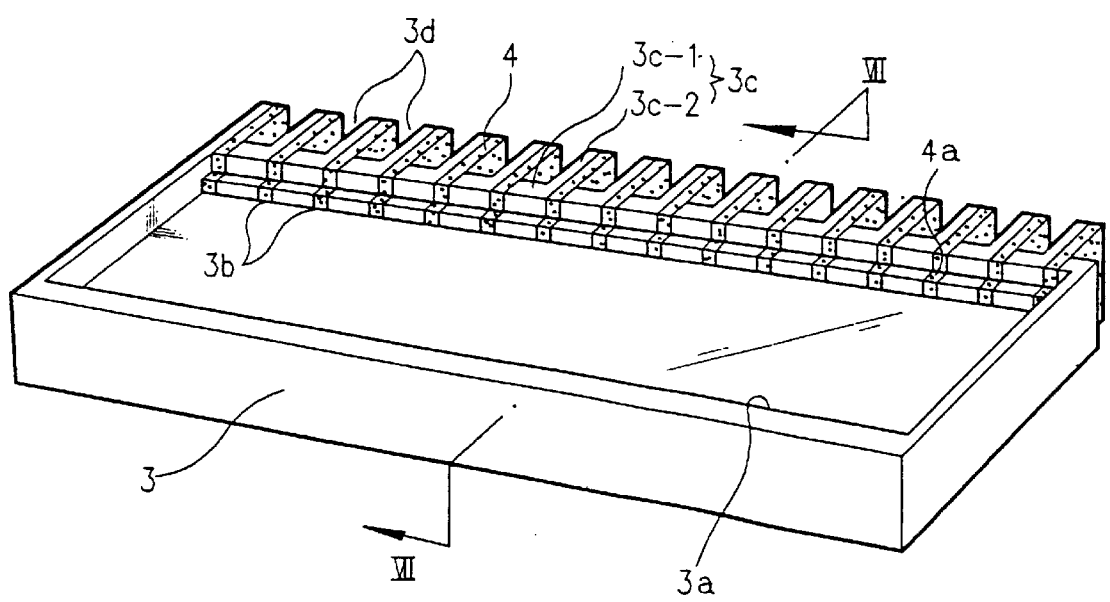
FIG. 6 illustrate a perspective view of the unit package body shown in FIG. 5 with a recess for the semiconductor chip formed therein.

Referring to FIG. 6, after slicing the body frame 12 in fixed widths at right angles to a direction of the slot 3b, the upper surface of the package body 3 is ground to form a recess 3a with the fore end of the conductive member 4 positioned within the recess 3a region. Also, the fore end of the conductive member 4 and package body 3 are ground together to form the same step structure.

Alternatively, the package body 3 is formed without the conductive members 4, and the upper surface of the package body 3 is ground to form the recess 3a and the step structure. Then, the conductive members 4 having a step structure are disposed in the slots 3b between adjacent first regions 3c-1.

Figure 7:
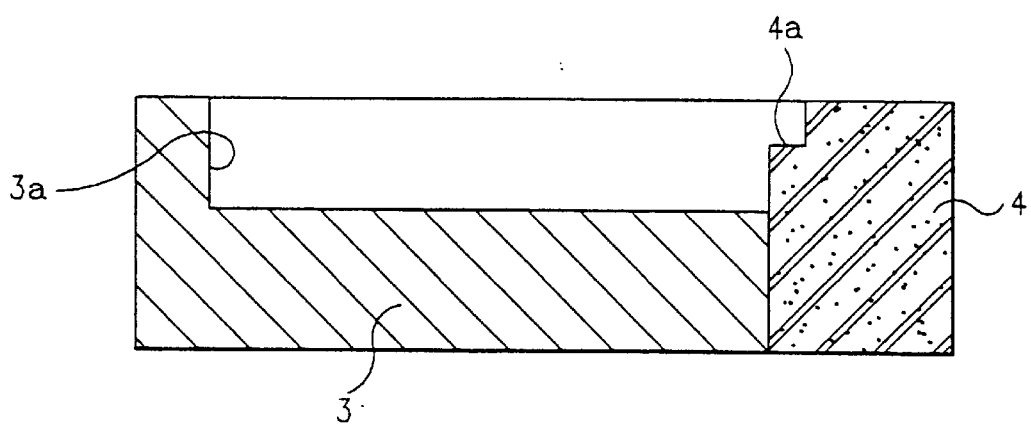
FIG. 7 illustrates a longitudinal section across the line VII—VII shown in FIG. 6.

FIG. 7 illustrates a longitudinal section across the line VII—VII shown in FIG. 6, and shows the upper surfaces and the bottom surfaces of the conductive member 4 and the package body 3.

Figure 8:
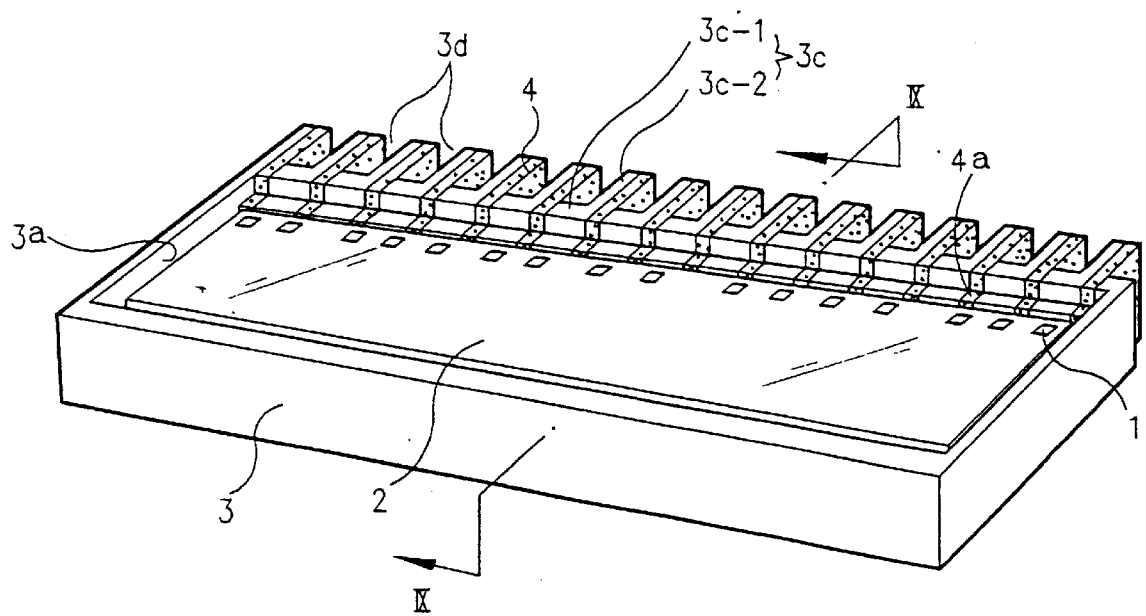
FIG. 8 illustrates a perspective view of the unit package body shown in FIG. 6 with the semiconductor chip placed in the recess.
Figure 9:
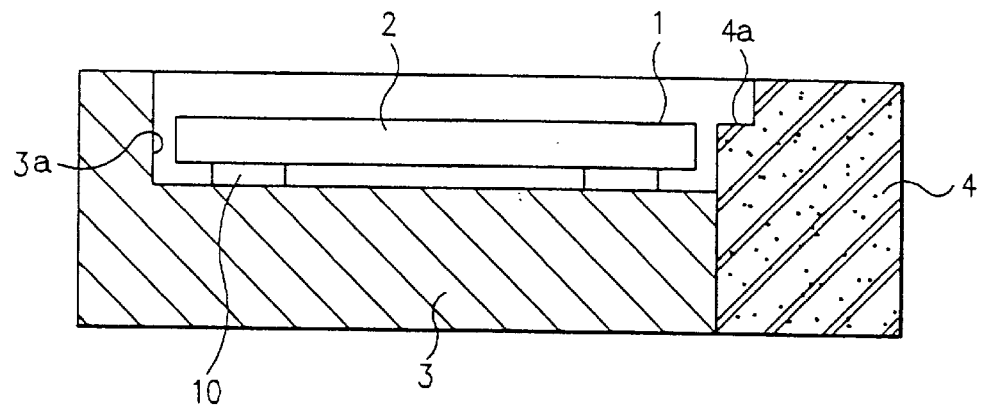
FIG. 9 illustrates a longitudinal section across the line IX—IX shown in FIG. 8.
Figure 10:
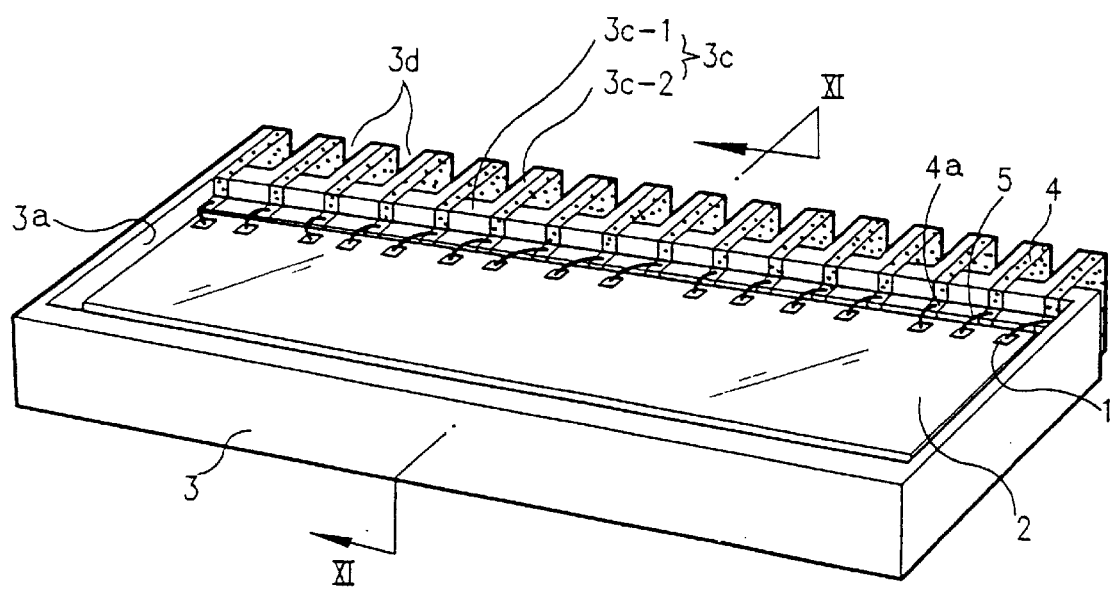
FIG. 10 illustrates a perspective view of the unit package body shown in FIG. 8 having the semiconductor chip placed in the recess and the conductive members connected to the semiconductor chip via connecting members.
Figure 11:
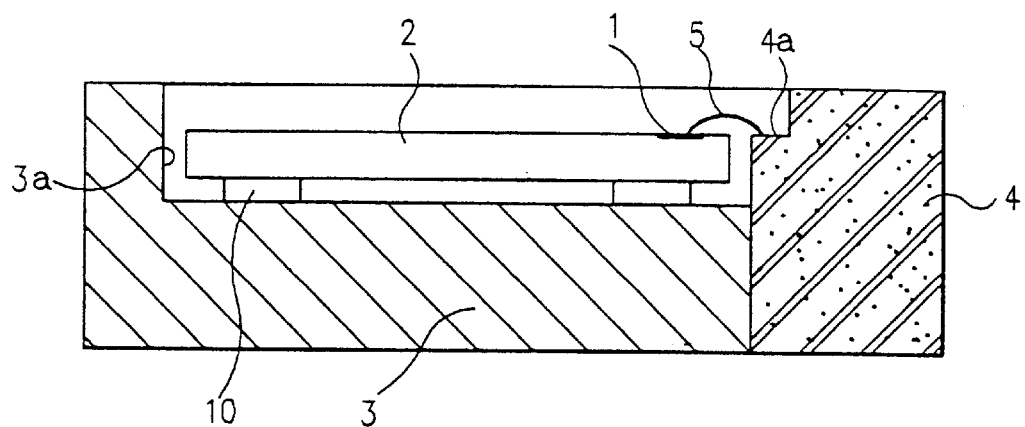
FIG. 11 illustrates a longitudinal section across the line XI—XI shown in FIG. 10.

Next, as shown in FIG. 8, the semiconductor chip 2 is placed in the recess 3a, and attached to the package body 3 by adhesive. FIG. 9 illustrates a longitudinal section across the line IX—IX shown in FIG. 8, and, shows the adhesive 11 attaching the semiconductor chip 2 to the package body 3. Then, as shown in FIG. 10, the bonding pads 1 on the semiconductor chip 2 are electrically connected to the step surface 4a of a corresponding one of the conductive members 4 using a connecting member 5 such as a wire. The wire is made of metal such as aluminum or copper alloy. Alternatively, different from the wires shown in FIG. 8, each of the bonding pads 1 is a bump on the semiconductor chip 2, and by inverting the semiconductor chip 2, the bonding pads 1 may be directly connected to the step surfaces 4a of the conductive members 4. FIG. 11 illustrates a longitudinal section across the line XI—XI shown in FIG. 10.

Figure 12:
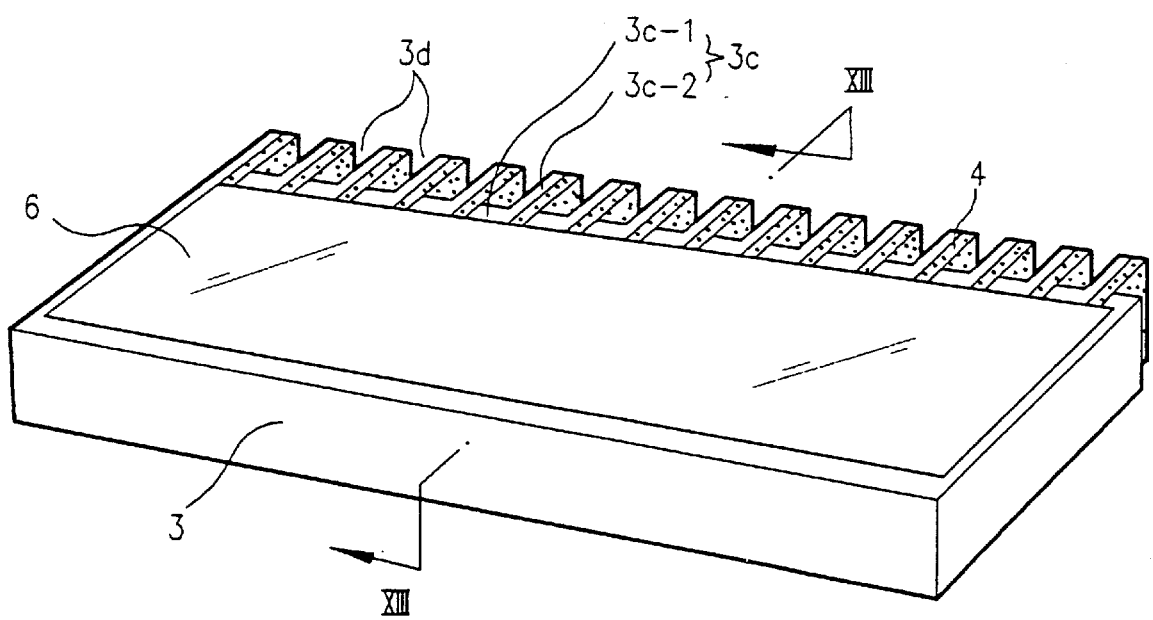
FIG. 12 illustrates a perspective view showing an outer appearance of the unit package body shown in FIG. 10 after being sealed with a sealing member.
Figure 13:
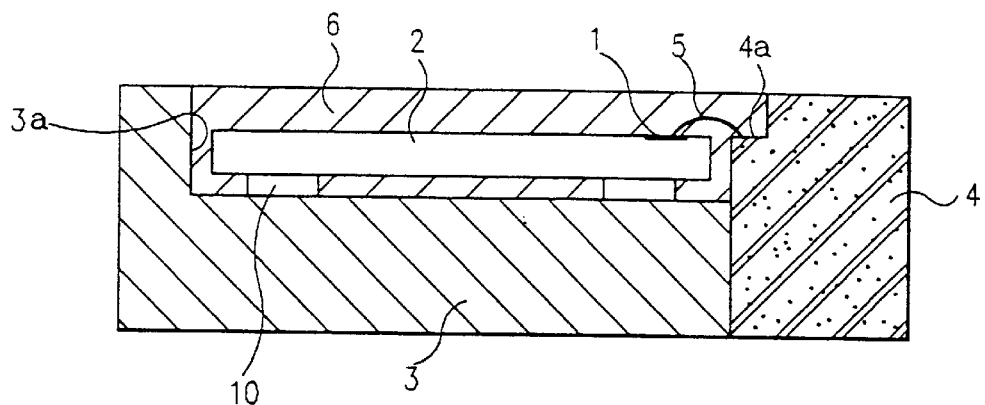
FIG. 13 illustrates a longitudinal section across the line XIII—XIII shown in FIG. 12.

After the wire bonding or bump connection, the semiconductor chip 2 and the connecting members 5 are sealed by a sealing member 6 as shown in FIG. 12; thereby the semiconductor chip package of the present invention is completed. FIG. 13 illustrates a longitudinal section across the line XIII—XIII shown in FIG. 12.

Figure 18A:
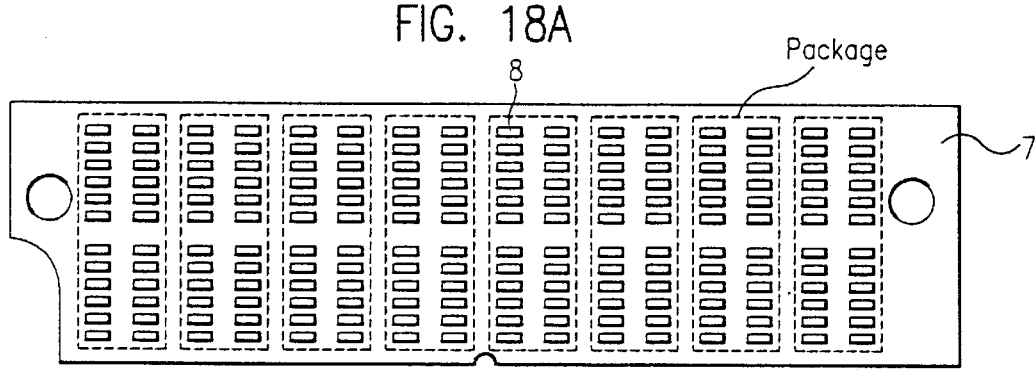
FIG. 18A illustrates a plan view of a mounting board having the conventional semiconductor chip packages mounted on pads of the mounting board shown in imaginary lines; and, FIG. 18B illustrates a plan view of the mounting board identical to the one of FIG. 18A having the semiconductor chip packages of the present invention mounted on pads of the mounting board shown in imaginary lines.
Figure 18B:
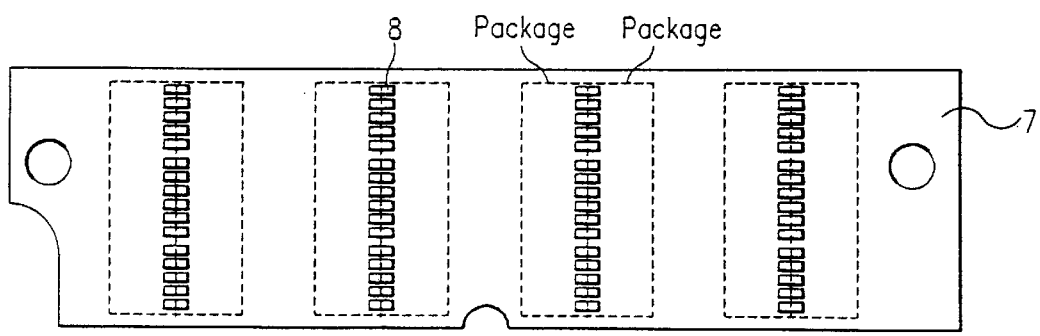

FIG. 18A illustrates a plan view of pads 8 of a 72 pin memory module for mounting the conventional semiconductor chip package, and FIG. 18B illustrates a plan view of pads 8 of a 72 pin memory module for mounting the semiconductor chip package of the present invention. A comparison of FIGS. 18A and 18B shows that the semiconductor chip package of the present invention can significantly improve mounting efficiency per unit area of the mounting board 7 because the semiconductor chip package of the present invention has the effect of simultaneous mounting at least two packages on a line of pads while only one conventional semiconductor chip package can be mounted on two lines of the pads 8.

As has been explained, since the semiconductor chip package of the present invention facilitates stacking of the semiconductor chip packages in both the transverse and longitudinal directions, the mounting area can be reduced. Also, since the semiconductor chip package of the present invention has no leads projecting from the package a device which is lighter, thinner, shorter, and smaller can be fabricated.

Because projecting leads have been eliminated, the conventional trimming/forming steps are no longer required, and productivity and yield are improved through simplification of the semiconductor chip packaging process.

It will be apparent to those skilled in the art that various modifications and variations can be made in the semiconductor chip package and the method for fabricating a semiconductor chip package of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor chip package, comprising the steps of:

(a) forming a package body with a plurality of conductive members attached thereto, the package body including a recess and a plurality of barrier parts formed along one side thereof, each of the barrier parts having a first region and a second region projecting from the first region, adjacent first regions being separated by a slot, and one of the conductive members disposed in each slot;

(b) disposing a semiconductor chip in the recess of the package body, the semiconductor chip including a reference surface having a circuit and a plurality of bonding pads formed thereon;

(c) electrically connecting each bonding pad with a corresponding conductive member; and (d) sealing the semiconductor chip and at least a portion of the conductive members in electrical contact with the semiconductor chip.

2. A method for fabricating a semiconductor chip package as claimed in claim 1, wherein the step (a) comprises the substeps of:

(a1) forming a body frame including the plurality of barrier parts formed along one side thereof, each of the barrier parts having the first region and the second region projecting from the first region, adjacent first regions being separated by a slot;

(a2) disposing one of the conductive members in each slot;

(a3) slicing the body frame into a plurality of package bodies;

(a4) forming a recess in one of the package bodies.

3. A method for fabricating a semiconductor chip package as claimed in claim 1, wherein the step (a) comprises the substeps of:

(a1) forming a body frame including the plurality of barrier parts formed along one side thereof, each of the barrier parts having the first region and the second region projecting from the first region, adjacent first regions being separated by a slot;

(a2) slicing the body frame into a plurality of package bodies;

(a3) forming a recess in one of the package bodies; and (a4) disposing one of the conductive members in each slot of the package body.

4. A method for fabricating a semiconductor chip package as claimed in claim 1, wherein the package body is formed of an insulating material.

5. A method for fabricating a semiconductor chip package as claimed in claim 4, wherein the insulating material is an epoxy molding compound.

6. A method for fabricating a semiconductor chip package as claimed in claim 4, wherein the insulating material is a plastic.

7. A method for fabricating a semiconductor chip package as claimed in claim 4, wherein the insulating material is a ceramic.

8. A method for fabricating a semiconductor chip package as claimed in claim 1, wherein the conductive members are formed of metal.

9. A method for fabricating a semiconductor chip package as claimed in claim 8, wherein the metal is aluminum.

10. A method for fabricating a semiconductor chip package as claimed in claim 8, wherein the metal is a copper alloy.

11. A method for fabricating a semiconductor chip package as claimed in claim 1, wherein the step (b) attaches the semiconductor chip to the package body using an adhesive.

12. A method for fabricating a semiconductor chip package as claimed in claim 11, wherein the adhesive is an epoxy.

13. A method for fabricating a semiconductor chip package as claimed in claim 11, wherein the adhesive is a polyimide.

14. A method for fabricating a semiconductor chip package as claimed in claim 1, wherein the step (a) forms the package body such that each conductive member is disposed in a slot adjacent to one of the second regions, each conductive member and adjacent second region form a projecting member, and adjacent projecting members are separated by a gap, the gap being wider than one of the conductive members is thick.

15. A method for fabricating a semiconductor chip package as claimed in claim 14, wherein the gap has a width equal to or greater than a thickness of one of the projecting members.

16. A method for fabricating a semiconductor chip package as claimed in claim 1, wherein the step (a) forms the package body such the barrier parts and the conductive members form one side wall of the recess.

17. A method for fabricating a semiconductor chip package as claimed in claim 2, wherein the step (a4) forms the recess by grinding.

18. A method for fabricating a semiconductor chip package as claimed in claim 3, wherein the step (a3) forms the recess by grinding.

19. A method for fabricating a semiconductor chip package as claimed in claim 1, wherein the step (a) forms the package body such that the barrier parts and the conductive members have a step structure, the step structure forming one side wall of the recess.

20. A method for fabricating a semiconductor chip package as claimed in claim 19, wherein the step (c) electrically connects each bonding pad to a step portion of the step structure of the corresponding conductive member.

21. A method for fabricating a semiconductor chip package as claimed in claim 1, wherein the step (c) electrically connects each bonding pad to a corresponding conductive member using a connecting member.

22. A method for fabricating a semiconductor chip package as claimed in claim 21, wherein the connecting member is a wire.

23. A method for fabricating a semiconductor chip package as claimed in claim 21, wherein the connecting member is a bump.

24. A method for fabricating a semiconductor chip package as claimed in claim 1, wherein the step (d) seals the semiconductor chip and the portions of the conductive members using an epoxy molding compound.

* * * * *